(12) United States Patent
Seesink

(10) Patent No.: US 9,748,898 B2
(45) Date of Patent: Aug. 29, 2017

(54) CURRENT DRIVEN CRYSTAL OSCILLATOR

(71) Applicant: Dialog Semiconductor B.V., s-Hertogenbosch (NL)

(72) Inventor: Petrus Hendrikus Seesink, Ouddorp (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 15/067,280

(22) Filed: Mar. 11, 2016

(65) Prior Publication Data

US 2016/0268971 A1    Sep. 15, 2016

(30) Foreign Application Priority Data

Mar. 13, 2015 (DE) .................. 10 2015 204 590

(51) Int. Cl.

| H03B 5/32 | (2006.01) |
|---|---|
| H03B 5/36 | (2006.01) |
| H03K 19/0175 | (2006.01) |
| H03B 5/12 | (2006.01) |
| H03B 5/30 | (2006.01) |
| H03B 5/06 | (2006.01) |

(52) U.S. Cl.
CPC .............. *H03B 5/364* (2013.01); *H03B 5/06* (2013.01); *H03B 5/12* (2013.01); *H03B 5/30* (2013.01); *H03B 5/32* (2013.01); *H03K 19/017509* (2013.01); *H03B 2200/0094* (2013.01)

(58) Field of Classification Search
CPC .. H03B 5/30; H03B 2200/0094; H03B 5/364; H03B 5/12; H03B 5/06; H03B 5/32; H03K 19/017509; H03L 5/00

USPC ................. 331/158, 116 FE, 116 R
See application file for complete search history.

(56) References Cited

U.S. PATENT DOCUMENTS

| 4,959,557 A * | 9/1990 | Miller ................. H03K 5/1565 |
|---|---|---|
| | | 327/175 |
| 5,923,222 A * | 7/1999 | Russell ................ H03F 3/3001 |
| | | 331/116 FE |
| 2014/0091869 A1 | 4/2014 | Tham | |

OTHER PUBLICATIONS

European Examination Report, File No. 10 2015 204 590.0, Applicant: Dialog Semiconductor B.V., Mail date: Oct. 29, 2015, 11 pgs, and English Language Translation, 14 pgs.

(Continued)

*Primary Examiner* — Arnold Kinkead
(74) *Attorney, Agent, or Firm* — Saile Ackerman LLC; Stephen B. Ackerman

(57) ABSTRACT

An oscillator circuit with an oscillator stage and a first current source arranged to drive the oscillator stage is presented. The oscillator stage has an oscillator stage input terminal, an oscillator stage output terminal, an oscillator arranged to provide an oscillating signal between the oscillator stage input terminal and the oscillator stage output terminal. The oscillator circuit has an operational amplifier with an inverting input, a non-inverting input and an operational amplifier output. The oscillator stage input terminal and the oscillator stage output terminal are coupled to the inverting input and non-inverting input. The operational amplifier output is coupled to the oscillator stage input terminal such that the oscillator stage input terminal and the oscillator stage output terminal are controlled to have a same DC voltage level.

18 Claims, 10 Drawing Sheets

(56) References Cited

OTHER PUBLICATIONS

Low-Power Crystal and MEMS Oscillators: The Experience of Watch Developments, Integrated Circuits and Systems, by Eric Vittoz, ISBN 978-90-481-9394-3, Springer Dordrecht Heidelberg London New York, Copyright Springer Science + Business Media B.V., 2010, pp. 129-131.

* cited by examiner

CURRENT DRIVEN CRYSTAL OSCILLATOR

TECHNICAL FIELD

The invention relates to oscillator circuits, and in particular, to crystal oscillator circuits.

BACKGROUND

A crystal oscillator is an electronic oscillator circuit that uses the mechanical resonance of a vibrating crystal of piezoelectric material to create a signal with a very precise frequency.

This frequency is commonly used to keep track of time, to provide a stable clock signal required by a digital system, and/or to stabilize frequencies for radio transmitters and receivers.

The most common type of piezoelectric material used in crystal oscillators is quartz crystal, but other materials like polycrystalline ceramics are also used.

Typically, quartz crystals are cut and mounted to vibrate best at a desired resonance frequency or a multiple of the desired resonant frequency. When the crystal is vibrating, it can be modeled as an RLC circuit producing a rapidly changing reactance with frequency, wherein the RLC circuit provides positive feedback and gain at the resonant frequency therefore producing sustained oscillations.

FIG. 1 illustrates a current-controlled CMOS-inverter oscillator circuit as known from E. Vittoz, "*Low-Power Crystal and MEMS Oscillators: The Experience of Watch Developments*", Integrated Circuits and Systems, FIG. 5.25, page 129, DOI 10.1007/978-90-481-9394-3. The circuit of FIG. 1 comprises a transistor $T_1$ having a gate $G_1$, a source $S_1$, and a drain $D_1$, a transistor $T_2$ having a gate $G_2$, a source $S_2$, and a drain $D_2$, a transistor $T_3$ having a gate $G_3$, a source $S_3$, and a drain $D_3$, a capacitor $C_1$ having a first end 10 and a second end 11, a capacitor $C_2$ having a first end 12 and a second end 13, a capacitor $C_3$ having a first end 14 and a second end 15, a resistor $R_1$ having a first end 16 and a second end 17 and a crystal oscillator 18 having a first end 19 and a second end 20. The source $S_1$ is connected to the source $S_2$ and to the second end 15 of the capacitor $C_3$. The drain $D_2$ is connected to the second end 17 of the resistor $R_1$, to the second end 20 of the crystal oscillator 18, to the drain $D_3$ and to the second end 13 of the capacitor $C_2$. The gate $G_2$ is connected to the first end 16 of the resistor $R_1$, to the first end 19 of the crystal oscillator 18, to the gate $G_3$ and to the second end 11 of the capacitor $C_1$. The first end 10 of the capacitor $C_1$ is connected to the source $S_3$, to the first end 12 of the capacitor $C_2$ and to the first end 14 of the capacitor $C_3$.

In the known circuit according to FIG. 1, the resistor $R_1$ is a feedback resistor from the drains $D_2$ and $D_3$, respectively, of the transistors $T_2$ and $T_3$, respectively, to the gates $G_2$ and $G_3$, of the transistors $T_2$ and $T_3$, respectively, to ensure that the DC voltage levels of these drains $D_2$ and $D_3$ and these gates $G_2$ and $G_3$ of the transistors $T_2$ and $T_3$, are the same. Therefore, the DC voltage level at both terminals 19, 20 of the oscillator crystal 18 is the same. Feedback resistor $R_1$ should have a very high resistance value in case of low power requirements, as it is consuming electrical power all the time.

SUMMARY

In a first aspect, the invention provides an oscillator circuit comprising an oscillator stage (OSC) and a first current source ($I_{ddx}$) arranged to drive said oscillator stage (OSC), the oscillator stage (OSC) comprising an oscillator stage input terminal, an oscillator stage output terminal, an oscillator ($X_1$) arranged to provide an oscillating signal between said oscillator stage input terminal and said oscillator stage output terminal, said oscillator circuit comprising an operational amplifier with an inverting input, a non-inverting input and an operational amplifier output, said oscillator stage input terminal and said oscillator stage output terminal being coupled to said inverting input and non-inverting input, and said operational amplifier output being coupled to the oscillator stage input terminal such that said oscillator stage input terminal and said oscillator stage output terminal are controlled to have a same DC voltage level.

By doing so, all elements in the oscillator circuit are current driven. This provides several features to the oscillator circuit, including much less spread over processing corners, the oscillator circuit is self-adjusting to a suitable supply voltage which will be as low as possible but not lower than a minimum value necessary for the oscillator circuit to operate properly and the individual components can be easily designed, especially scaling is simple.

The dependent claims are focusing on advantageous embodiments.

In an embodiment, as claimed in claims 15 and 16, the oscillator circuit may work in a transceiver mode wherein stabilized frequencies for radio transmitters and/or receivers can be generated. In this mode, rising/falling edges of the generated oscillating signal as eventually produced should be as accurate as possible such that they define moments in time at which certain actions may start/end are as accurate as possible. This is achieved by injecting relatively more current in the oscillator circuit by current source $I_{ddx}$ such that lower phase noise is obtained.

In another embodiment, as claimed in claims 17 and 18, the oscillator circuit illustrated may work in a timer mode in order to provide a stable clock signal. In this embodiment, requirements as to phase noise are less strict because the timer will count an average number of oscillation cycles by counting the number of rising/falling edges only. So, here, the current as injected into the oscillator circuit by current source $I_{ddx}$ can be much less than in the transceiver mode.

The person skilled in the art will understand that the features described above may be combined in any way deemed useful.

BRIEF DESCRIPTION OF THE DRAWINGS

In the following, aspects of the invention will be elucidated by means of examples, with reference to the drawings. The drawings are diagrammatic and may not be drawn to scale.

The features and effects of the present invention will be explained in more detail below with reference to drawings in which preferred and illustrative embodiments of the invention are shown. The person skilled in the art will realize that other alternatives and equivalent embodiments of the invention can be conceived and reduced to practice without departing from the scope of the present invention.

DESCRIPTION

The examples and embodiments described herein serve to illustrate rather than to limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single or multiple hardware items combining the features of the items described.

Figure 2:
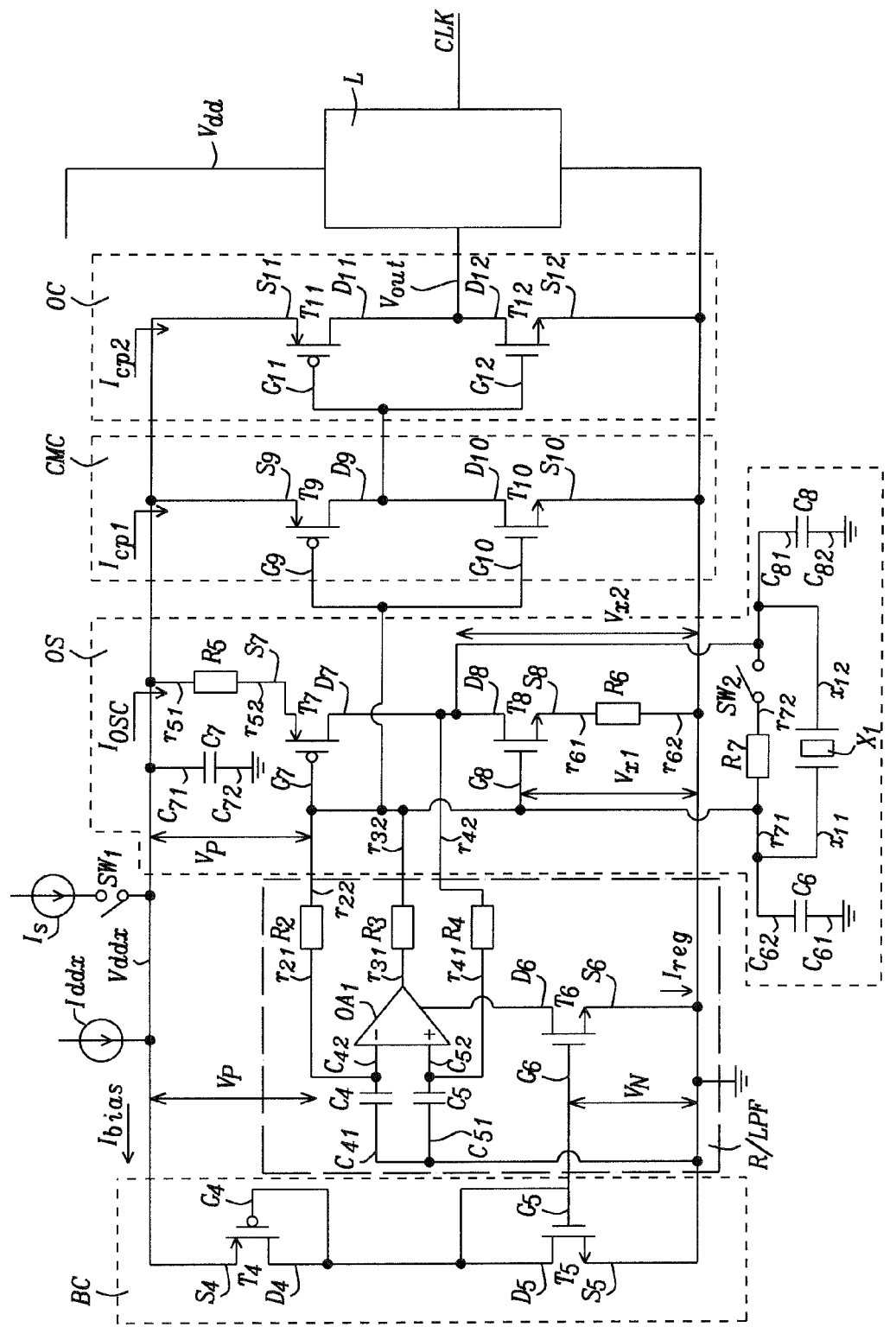
FIG. 2 illustrates a current driven crystal oscillator circuit according to one embodiment of the invention.

FIG. 2 illustrates a current driven crystal oscillator circuit according to one embodiment of the invention.

The current driven crystal oscillator circuit of FIG. 2, seen from left to right, comprises a series circuit of the following sub-circuits: a bias circuit BC, a regulator $OA_1$ and Low Pass Filter circuit R/LPF, an oscillator stage OS, a current-mode comparator CMC, and an output circuit OC. A level shifter L receives an output voltage $V_{out}$ of output circuit OC.

The current driven crystal oscillator circuit of FIG. 2 comprises a plurality of transistors $T_i$ (i=4, 5, . . . , 12). Each one of these transistors $T_i$ has a respective gate $G_i$, a source $S_i$, and a drain $D_i$. For the sake of simplicity, a transistor $T_i$ will be called an $i^{th}$ transistor in the specification hereinafter. It is observed that the reference number concerned may be different in the claims, as they may appear in another order in the claims.

The current driven crystal oscillator circuit of FIG. 2 includes a resonating crystal $X_1$ and a current source $I_1$.

FIG. 2, also shows the currents received by each of the sub-circuits: the bias circuit BC receives a current $I_{bias}$, the regulator and Low Pass Filter circuit R/LPF receives a current $I_{reg}$, the oscillator stage OS receives a current $I_{osc}$, the current-mode comparator CMC receives a current $I_{cp1}$, and the output circuit OC receives a current $I_{cp2}$.

The bias circuit BC of the current driven crystal oscillator circuit includes a fourth P-type transistor $T_4$ and a fifth N-type transistor $T_5$ having their respective drain terminals $D_4$ and $D_5$ connected to each other, and their gate terminals $G_4$ and $G_5$ respectively connected to their drain terminals $D_4$ and $D_5$. The source terminal $S_5$ of the N-type transistor $T_5$ is connected to ground and the source terminal $S_4$ of the P-type transistor $T_4$ is connected to the current source $I_1$.

The R/LPF circuit of the current driven crystal oscillator circuit of FIG. 2 includes an operational amplifier $OA_1$, a capacitor $C_4$ having a first end $c_{41}$ and a second end $c_{42}$, a capacitor $C_5$ having a first end $c_{51}$ and a second end $c_{52}$, a resistor $R_2$ having a first end $r_{21}$ and a second end $r_{22}$, a resistor $R_3$ having a first end $r_{31}$ and a second end $r_{32}$, a resistor $R_4$ having a first end $r_{41}$ and a second end $r_{42}$, and a sixth N-type transistor $T_6$ having a source $S_6$, a drain $D_6$ and a gate $G_6$. The second end $c_{42}$ of the capacitor $C_4$ is connected to the inverting input of the operational amplifier $OA_1$, the second end $c_{52}$ of the capacitor $C_5$ is connected to the non-inverting input of the operational amplifier $OA_1$ and the first end $c_{41}$ of the capacitor $C_4$ is connected to the first end $c_{51}$ of the capacitor $C_5$ and to the ground. The gate $G_6$ of the transistor $T_6$ is connected to the gate $G_5$ of the transistor $T_5$, the drain $D_6$ of the transistor $T_6$ is connected to the negative power supply of the operational amplifier $OA_1$, and the source $S_6$ of the transistor $T_6$ is connected to the ground. The output of the operational amplifier $OA_1$ is connected to the first end $r_{31}$ of the resistor $R_3$, the second end $r_{32}$ of the resistor $R_3$ is connected to the second end $r_{22}$ of the resistor $R_2$ and to the second end $r_{42}$ of the resistor $R_4$, the first end $r_{21}$ of the resistor $R_2$ is connected to the inverting input of the operational amplifier $OA_1$ and the first end $r_{41}$ of the resistor $R_4$ is connected to the non-inverting input of the operational amplifier $OA_1$.

Furthermore, the oscillator stage OS of the current driven crystal oscillator circuit of FIG. 2 includes an eighth N-type transistor $T_8$ having a source $S_8$, a drain $D_8$ and a gate $G_8$, a seventh P-type transistor $T_7$ having a source $S_7$, a drain $D_7$ and a gate $G_7$, a capacitor $C_7$ having a first end $c_{71}$ and a second end $c_{72}$, a resistor $R_5$ having a first end $r_{51}$ and a second end $r_{52}$, a resistor $R_6$ having a first end $r_{61}$ and a second end $r_{62}$. The first end $r_{51}$ of the resistor $R_5$ is connected to the first end $c_{71}$ of the capacitor $C_7$ and to the current source $I_1$. The second end $c_{72}$ of the capacitor $C_7$ is connected to the ground and the second end $r_{52}$ of the resistor $R_5$ is connected to the source $S_7$ of the transistor $T_7$. The gate $G_7$ of the transistor $T_7$ is connected to the second end $r_{22}$ of the resistor $R_2$ and the drain $D_7$ of the transistor $T_7$ is connected to the drain $D_8$ of the transistor $T_8$. The gate $G_8$ of the transistor $T_8$ is connected to the second end $r_{22}$ of the resistor $R_2$ and the source $S_8$ of the transistor $T_8$ is connected to the first end $r_{61}$ of the resistor $R_6$. Furthermore, the oscillator stage OS of the current driven crystal oscillator circuit of FIG. 2 includes a resistor $R_7$ having a first end $r_{71}$ and a second end $r_{72}$ and a switch $S_2$ wherein the first end $r_{71}$ of the resistor $R_7$ is connected to the second end $c_{62}$ of the capacitor $C_6$, the second end $r_{72}$ of the resistor $R_7$ is connected to one end of the switch $S_2$ and the other end of the switch $S_2$ is connected to the first end $c_{81}$ of the capacitor $C_8$.

The current-mode comparator CMC of the current driven crystal oscillator circuit of FIG. 2 includes a tenth N-type transistor $T_{10}$ having a source $S_{10}$, a drain $D_{10}$ and a gate $G_{10}$ and a ninth P-type transistor $T_9$ having a source $S_9$, a drain $D_9$ and a gate $G_9$. The gate $G_9$ of the ninth transistor $T_9$ is connected to the gate $G_{10}$ of the tenth transistor $T_{10}$ and to second end $r_{22}$ of the resistor $R_2$. The drain $D_9$ of the ninth transistor $T_9$ is connected to the drain $D_{10}$ of the tenth transistor $T_{10}$. The source $S_{10}$ of the tenth transistor $T_{10}$ is connected to the ground and the source $S_9$ of the ninth transistor $T_9$ is connected to the current source $I_1$.

The output circuit OC of the current driven crystal oscillator circuit of FIG. 2 includes a twelfth N-type transistor $T_{12}$ having a source $S_{12}$, a drain $D_{12}$ and a gate $G_{12}$ and an eleventh P-type transistor $T_{11}$ having a source $S_{11}$, a drain $D_{11}$ and a gate $G_{11}$. The gate $G_{11}$ of the eleventh transistor $T_{11}$ is connected to the gate $G_{12}$ of the twelfth transistor $T_{12}$ which are together connected to the drains $D_9$, $D_{10}$ of the ninth and tenth transistors $T_9$, $T_{10}$, respectively. The drain $D_{11}$ of the eleventh transistor $T_{11}$ is connected to the drain $D_{12}$ of the twelfth transistor $T_{12}$, The source $S_{12}$ of the twelfth transistor $T_{12}$ is connected to the ground and the source $S_{11}$ of eleventh the transistor $T_{11}$ is connected to the current source $I_1$.

Furthermore, the current driven crystal oscillator circuit of FIG. 2 includes a capacitor $C_6$ having a first end $c_{61}$ and a second end $c_{62}$, a capacitor $C_8$ having a first end $c_{81}$ and a second end $c_{82}$, a resistor $R_7$ having a first end $r_{71}$ and a second end $r_{72}$, and crystal oscillator $X_1$ having a first end $x_{11}$ and a second end $x_{12}$. The first end $c_{61}$ of the capacitor $C_6$ is connected to the ground, the second end $c_{82}$ of the capacitor $C_8$ is connected to the ground, the second end $c_{62}$ of the capacitor $C_6$ is connected to the first end $r_{71}$ of the resistor $R_7$, to the first end $x_{11}$ of the crystal oscillator $X_1$, and to the second end $r_{22}$ of the resistor $R_2$. The second end $r_{72}$ of the resistor $R_7$ is connected, via a switch $SW_2$ to first end $c_{81}$ of the capacitor $C_8$, to the second end $x_{12}$ of the crystal oscillator $X_1$, and to the second end $r_{42}$ of the resistor $R_4$.

Finally, the circuit of FIG. 2 comprises a further current source $I_S$ having an output connected to an output of the current source $I_1$ via a switch $SW_1$. So, all elements in the oscillator circuit shown in FIG. 2 are current driven. This provides several features to the oscillator circuit, including:

Much less spread over processing corners
The oscillator circuit is now self-adjusting to a suitable supply voltage which will be as low as possible but not lower than a minimum value necessary for the oscillator circuit to operate properly
The individual components can be easily designed, especially scaling is simple.

The basic operation of the circuit of FIG. 2 will now be described.

Figure 1:
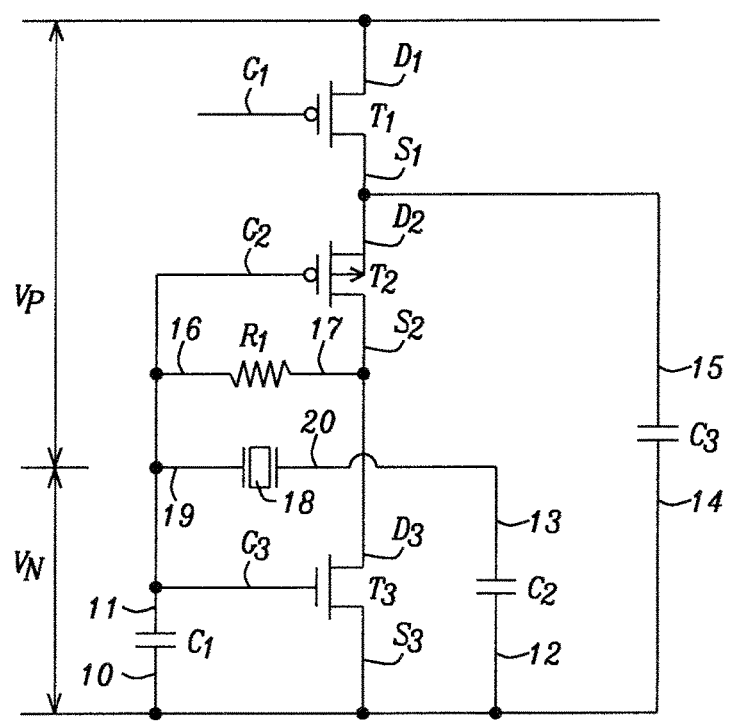
FIG. 1 illustrates a current-controlled CMOS-inverter oscillator circuit.

The person skilled in the art will recognize that the oscillator stage OS has a similar construction as the oscillator shown in FIG. 1. The main differences between the oscillator stage OS and the oscillator of FIG. 1 are that the feedback resistor $R_1$ is replaced by the regulator $OA_1$, that source $S_8$ of eighth transistor $T_8$ is connected to ground via resistor $R_6$, that the source $S_7$ of seventh transistor $T_7$ is connected to resistor $R_5$, and that resistor $R_7$ (which is comparable to resistor $R_1$ in FIG. 1) is arranged in series with switch $SW_2$. Moreover all peripheral circuits of the oscillator are supplied by current source $I_{ddx}$.

Figure 3:
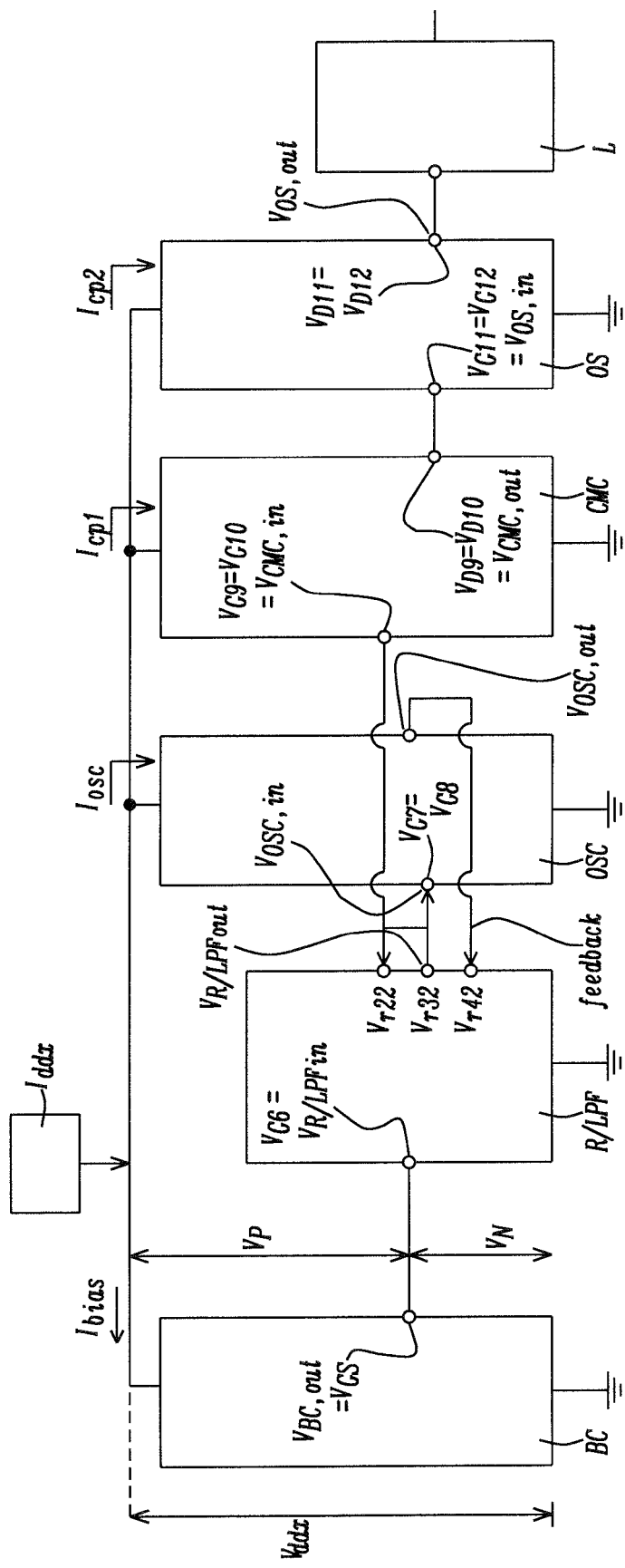
FIG. 3 shows a higher level block diagram of the circuit according to FIG. 2.

FIG. 3 shows a higher level block diagram of the circuit according to FIG. 3 only showing the current source $I_{ddx}$, the bias circuit BC, the regulator/Low Pass Filter circuit R/LPF, the oscillator stage OSC, the current mode comparator CMC, and output stage OS, and their mutual connections.

The bias circuit BC provides an output voltage $V_{BC,out}$.

The regulator/Low Pass Filter circuit R/LPF receives the output voltage $V_{BC, out}$ of the bias circuit BC as its input voltage $V_{R/LPF,in}$. Moreover, the regulator/Low Pass Filter circuit R/LPF provides an output voltage $V_{R/LPF,out}$ to the input of the oscillator stage OSC. Furthermore, the operational amplifier $OA_1$ in the regulator/Low Pass Filter circuit R/LPF receives a feedback signal which is derived from the voltage difference between the input and output of the oscillator stage OSC, which, in the shown embodiment is equal to the voltage across the oscillator $X_1$.

The regulator/Low Pass Filter circuit R/LPF is arranged such that DC input voltage of the oscillator stage OSC is equal to the DC output voltage of the oscillator stage OSC. In the shown embodiment this is taken care of by the operational amplifier $OA_1$ in regulator R/LPF which charges/discharges capacitor $C_6$ so that the average input voltage of the oscillator stage OSC is equal to the average output voltage of the oscillator stage OSC. It is observed that a feedback of the voltage difference between the input and output of the oscillator stage OSC to any type of operational amplifier of which the output is coupled to the input of the oscillator stage OSC can be used for this purpose.

In contrast to most other oscillators, in the preferred embodiment, the comparator is not a 'voltage-mode' comparator. Such a 'voltage-mode' comparator would have its input connected to the output of the oscillator stage OSC. Here, the input of the current-mode comparator CMC is connected to the input of the oscillator stage OSC. The current-mode comparator CMC flags if the absolute current through transistor T7 is larger or smaller than the absolute current through transistor T6. A voltage-mode comparator could be used as well, though would result in more phase noise.

The oscillator and all its peripheral circuits run at self-biasing voltage $V_{ddx}$. $V_{ddx}$ is lower than the supply voltage $V_{dd}$ of other circuitry to save power in the oscillator. Inside the oscillator, apart from the level shifter, the logic level is the internal supply voltage $V_{ddx}$. The output stage of the oscillator is a level-shifter L which converts the logic level of the signal as received by the output circuit OC to the supply voltage $V_{dd}$ of the circuitry to which the resulting oscillating signal is to be provided.

The bias circuit BC of FIG. 3 receives a current from the current source $I_{ddx}$ at the source $S_4$ of the transistor $T_4$. See also FIG. 2. This current generates a voltage $V_{gs4}$ between the gate $G_4$/drain $D_4$ and the source $S_4$ of the transistor $T_4$ such that $T_4$ is in saturation mode. The transistor $T_4$ working in saturation provides a current $I_{bias}$ to the transistor $T_5$. As a consequence, a voltage $V_P$ is present between the source $S_4$ and the gate $G_4$/drain $D_4$ of the transistor $T_4$, and a voltage $V_N$ is present between the drain $D_5$/gate $G_5$ and the source $S_5$ of the transistor $T_5$. Defining the output voltage of current source $I_{ddx}$ as $V_{ddx}$ the following equation holds:

$$V_{ddx} - V_P = V_N$$

Transistor $T_5$ is connected in a current mirror arrangement with transistor $T_6$. I.e., the voltage across the gate-source of transistor $T_6$ is equal to the voltage across the gate-source of transistor $T_5$. Since all transistors have been produced in the same manufacturing step on the same die, the current that flows through transistor $T_6$ has a fixed ratio to the one flowing through transistor $T_5$ as determined by their relative surface areas. The drain current through T6 is the bias current of the operational amplifier $OA_1$ in regulator R/LPF (see e.g., the embodiment of FIG. 4). The reference voltage at the non-inverting input of the operational amplifier $OA_1$ is the low-pass filtered output voltage of oscillator stage OSC (high frequency components in the output voltage of oscillator stage OSC are short-circuited to ground via capacitor $C_5$). The feedback voltage of the regulator R/LPF at the inverting input of the operational amplifier $OA_1$ is the low-pass filtered input voltage of oscillator stage OSC (high frequency components in the output voltage of oscillator stage OSC are short-circuited to ground via capacitor $C_4$). The output of the regulator R/LPF is connected to the input of the oscillator stage OSC and charges/discharges capacitor $C_6$ until the voltage at both inputs of the operational amplifier $OA_1$ in the regulator R/LPF are the same. As the $W_i/L_i$ ratio's of $T_7$ and $T_8$ are similar to $T_4$ and $T_5$ (wherein $W_i$ represents the channel width of transistor $T_i$ and $L_i$ represents the channel length of transistor $T_i$) the average of input and output voltage of the oscillator stage OSC is equal to $V_N$. The same applies for the $W_i/L_i$ ratio's of the transistors of stages CMC and OC and therefore their turn-over point is close to a voltage level equal to $V_N$.

Therefore, due to the configuration of the circuit of FIG. 2, the same voltage difference $V_P$ is present between the output voltage $V_{ddx}$ of the current source $I_{ddx}$ and the gate $G_7$ of the transistor $T_7$, between the output voltage $V_{ddx}$ of the current source $I_{ddx}$ and the gate $G_9$ of the transistor $T_9$, and between the output voltage $V_{ddx}$ of the current source $I_{ddx}$ and the gate $G_{11}$ of the transistor $T_{11}$. Also for the same reason, the same voltage difference $V_N$ is present between the gate $G_8$ of the transistor $T_8$ and ground, between the gate $G_{10}$ of the transistor $T_{10}$ and ground, and between the gate $G_{12}$ of the transistor $T_{12}$ and ground.

As can be seen in the circuit of FIG. 2, the voltage between the output of the current source $I_{ddx}$ and ground is $V_N + V_P$.

In this way, all the stages of the circuit of FIG. 3, namely the bias circuit BC, the regulator/LPF circuit R/LPF, the oscillator stage OSC, the current-mode comparator CMC and the output stage OS, are well-balanced independent of the processing corner of the total circuit, the actual temperature in use and the injected current in use.

The DC voltage at the output of the operational amplifier $OA_1$ follows the DC voltage present at the inverting and non-inverting inputs of the operational amplifier $OA_1$ which are controlled to be the same.

The resistor $R_3$ at the output of the operational amplifier $OA_1$ prevents that a rail-to-rail swing of the voltage $V_{x1}$ is causing linearity errors in the regulator and LPF circuit R/LPF.

The operational amplifier $OA_1$ is connected in a closed loop wherein the output of the operational amplifier $OA_1$, which is connected to the input of the oscillator stage OSC, is fed back to the inverting input of the operational amplifier $OA_1$ via resistor $R_2$. The non-inverting input of the operational amplifier $OA_1$ is connected through the resistor $R_4$ to the output of the oscillator stage OSC. So, stated differently the input and the output of the oscillator stage OSC are feedback to the inverting and non-inverting inputs of the operational amplifier $OA_1$. In use, these inverting and non-inverting inputs will have the same DC voltage level. In this way, the operational amplifier $OA_1$ of the regulator and LPF circuit R/LPF controls that the DC voltage level at the input of the oscillator stage OSC is the same as the DC voltage level at the output of the oscillator stage OSC. So, the operational amplifier $OA_1$ substitutes resistor $R_1$ in the prior art setup of FIG. 1, the advantage being that such an operational amplifier $OA_1$ dissipates less electrical energy in use.

However, providing only this feedback circuit with the operational amplifier $OA_1$ would cause a relatively slow start-up of the total circuit.

Therefore, the series connection of resistor $R_7$ and switch $SW_2$ has been provided which has the same function as resistor $R_1$ in the circuit according to the prior art (FIG. 1), however, only at the time of starting the circuit. I.e., at the time of starting, the switches $SW_1$ and $SW_2$ are both closed such as to allow current to flow. Oscillator crystal $X_1$ oscillates and provides an oscillating signal at its output terminals $x_{11}$ and $x_{12}$. An oscillating voltage is built up across the resistor $R_7$. This oscillating signal across oscillator crystal $X_1$ is output to the inverting and non-inverting input terminals of the operational amplifier $OA_1$ in the R/LPF circuit such that its output also generates an oscillating signal which is, then, provided to the rest of the circuit, as explained above. In the circuit of FIG. 3, after initialisation, i.e., when the operational amplifier $OA_1$ provides a stable oscillating signal at its output, switches $SW_1$ and $SW_2$ are opened such that no current will flow anymore through them. Then, no current will flow anymore through resistor $R_7$ either, thus saving energy. Even though, after initialisation, the resistor $R_7$ is disconnected from the circuit, the operational amplifier $OA_1$ in R/LPF circuit causes the DC voltage difference across the oscillator crystal $X_1$ to be 0 (zero). I.e., both terminals $x_{11}$ and $x_{12}$ are controlled to be at the same DC voltage $V_N$. A method to control the opening of switches SW1 and SW2 is to count a predetermined number of generated pulses by the oscillator after start-up. To that end, the output signal of the oscillator can be fed to a counting circuit which counts the number of pulses of the generated signal and which is arranged to control the opening/closing of switches SW1b and SW2. For example SW1 and SW2 are opened by such a counting circuit if 1024 pulses are counted.

On average, in a preferred embodiment, DC voltages $V_{x1}$, $V_{x2}$, $V_N$, and $V_P$ are substantially the same in the circuit of FIG. 3. Here, "substantially" means that these DC voltages are intended to have the same values but they may differ slightly in practice, due to tolerances in design of the different used transistors.

In the oscillator stage OSC of the circuit of FIG. 2 no amplitude control is required as the current source $I_{ddx}$ defines the voltage $V_{ddx}$. The oscillator stage OSC is a push/pull stage with a double gm if compared with a single transistor "grounded source" configuration at the same current. Apart from a small voltage drop across the respective resistors $R_5$ and $R_6$, the voltage at the interconnected drains $D_7$ and $D_8$ swings between ground and voltage $V_{ddx}$. The resistors $R_5$ and $R_6$ soften the clamping of $V_{x2}$.

Apart from the resistors $R_5$ and $R_6$, the current mode comparator CMC is a copy of the oscillator stage OSC, but the oscillator stage OSC drives a heavy load, i.e. the load capacitors $C_6$ and $C_8$, that requires relative high current, while the current-mode comparator CMC itself drives a tiny load, i.e. output circuit OC, that allows the output of the output circuit OC to jump from "rail to rail", i.e. between voltage $V_{ddx}$ and ground. The voltage drop at peak currents over the resistors $R_5$ and $R_6$ boosts the current-gain of the current-mode comparator CMC.

The output stage OS is a copy of the current-mode comparator CMC. However, the respective sizes of the transistors $T_{11}$ and $T_{12}$ differ from the respective sizes of the transistors $T_9$ and $T_{10}$, such that the current consumption is very low, the output stage OS form a relatively small load to the current-mode comparator CMC, and can drive a relatively heavy load itself.

To summarize, the basic functionalities of the respective functional blocks of FIGS. 2 and 3 are as follows:

Current source $I_{ddx}$: arranged to provide a constant current to the entire current driven oscillator circuit; eventually $I_{ddx}$ can have a temperature coefficient to fine tune the Temperature Coefficient TC performance of the oscillator.

Bias circuit BC: arranged to provide a well-defined first DC output voltage $V_{BC,out}$;

Regulator and LPF circuit R/LPF: arranged to provide a same second DC output voltage $V_{R/LPC}$ at two different output terminals while allowing an oscillating voltage signal to be present between these two output terminals;

Oscillator stage OSC: arranged to provide a first oscillating signal $V_{OSC,out}$;

Current-mode comparator CMC: arranged to receive the oscillating signal $V_{OSC}$ and to provide an amplified oscillating signal. This amplified oscillating signal clamps between ground and $V_{ddx}$.

Output stage OS: arranged to form a small load to the output of the current mode comparator CMC and to allow driving the level shifter L.

Level shifter L: arranged to convert the logic level of the output signal $V_{CMC,out}$ of the current-mode comparator CMC to a required logic level of the circuits receiving the oscillator signal of the oscillator as shown in FIGS. 2 and 3.

Figure 4:
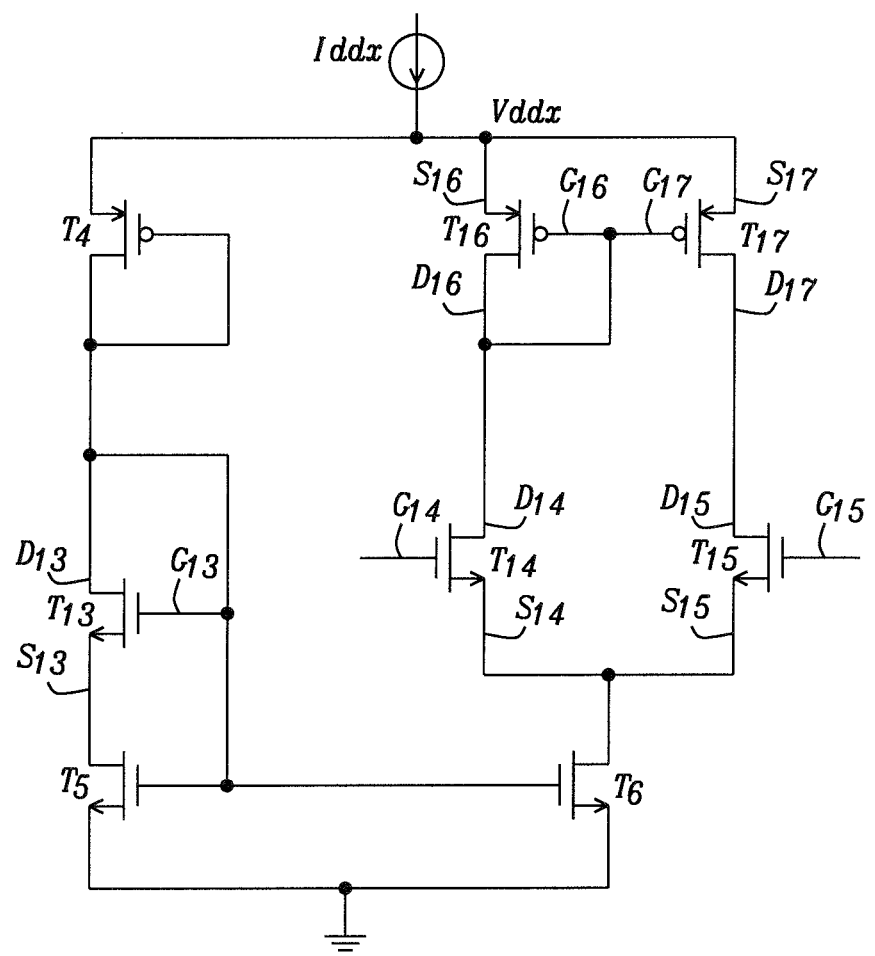
FIG. 4 shows an alternative bias circuit BC' to the one shown in FIG. 2 as well as an example of the operational amplifier $OA_1$ of the oscillator circuit.
Figure 5:
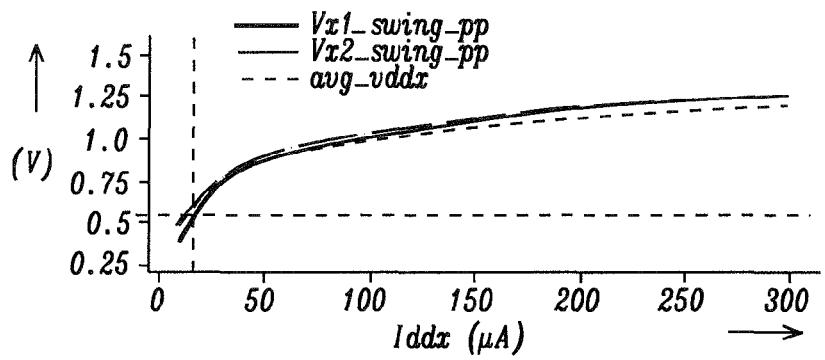
FIG. 5, FIG. 6, FIG. 7, FIG. 8 and FIG. 9 illustrate simulation results of the current driven crystal oscillator circuit of FIG. 2 working in a transceiver mode.
Figure 6:
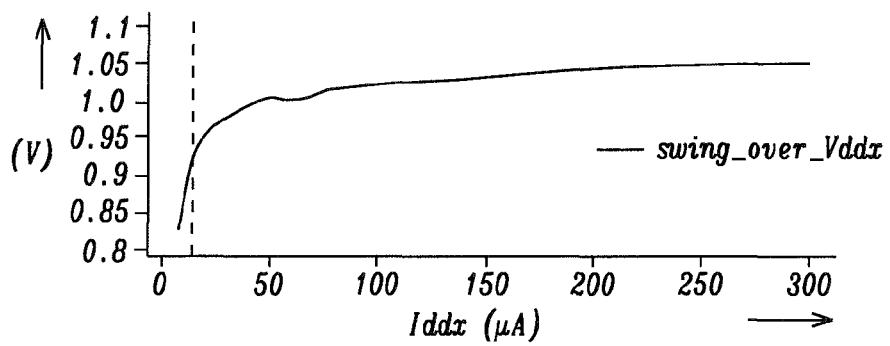
Figure 7:
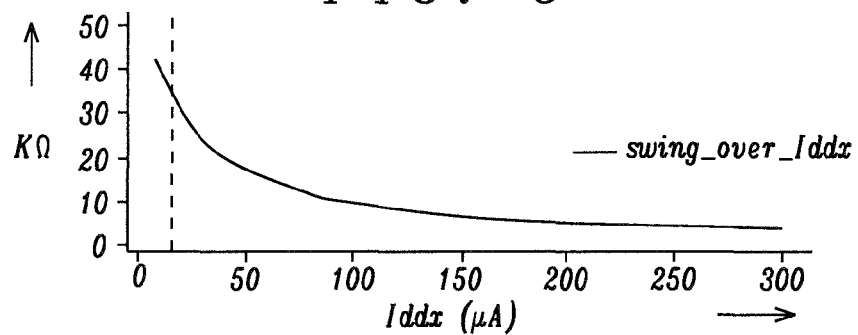
Figure 8:
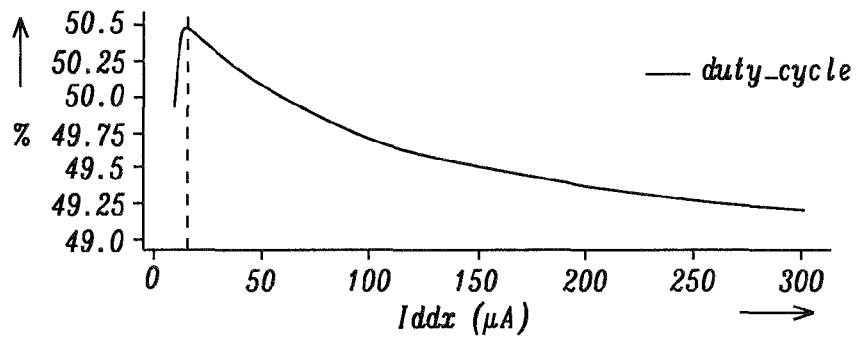
Figure 9:
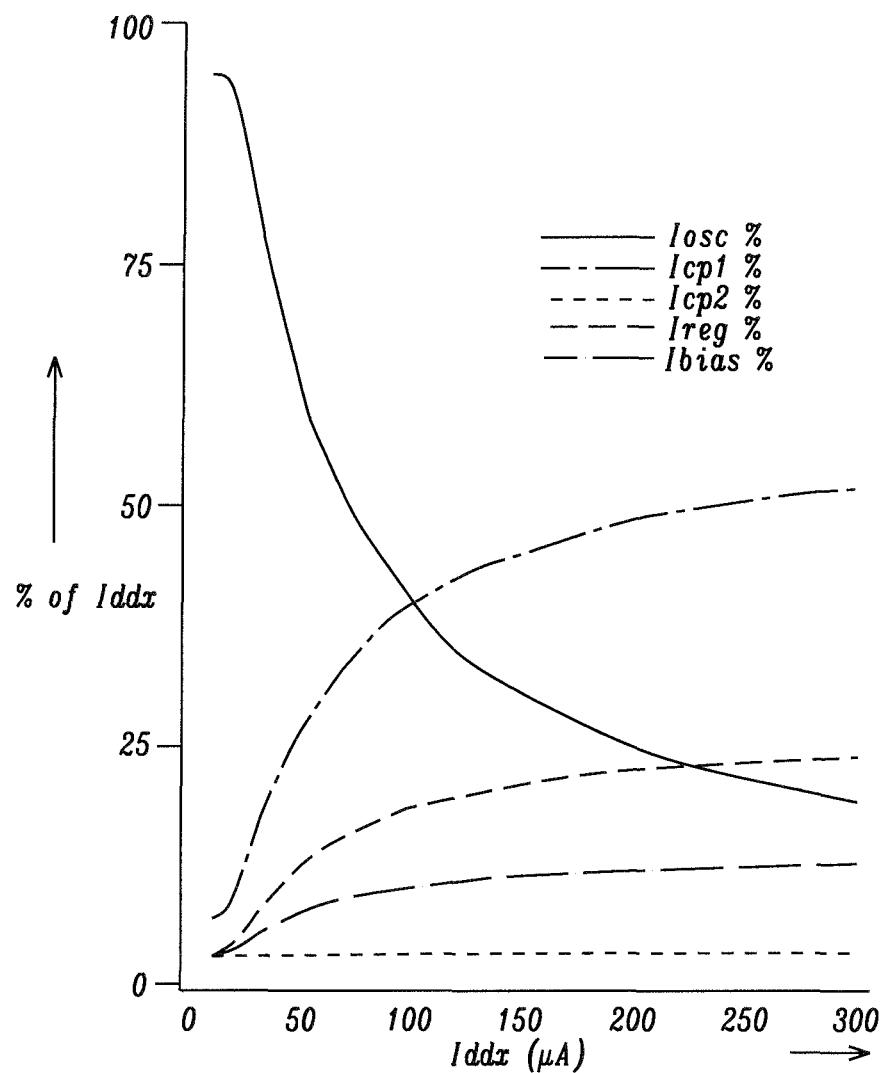
Figure 10:
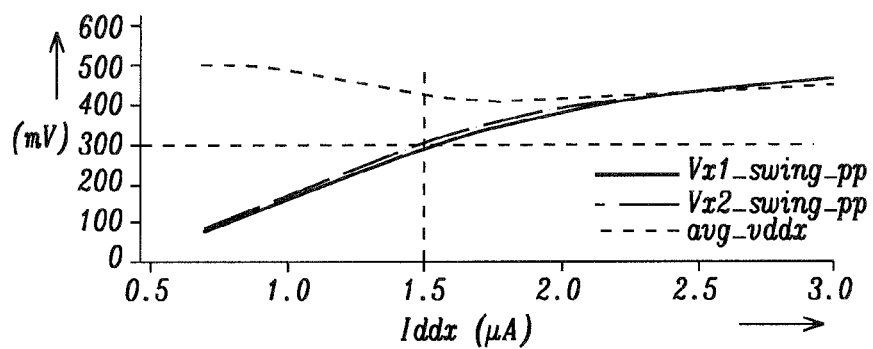
FIG. 10, FIG. 11, FIG. 12 and FIG. 13, FIG. 14, FIG. 15, FIG. 16, FIG. 17, FIG. 18 and FIG. 19 illustrate simulation results of the current driven crystal oscillator circuit of FIG. 2 working in a timer mode.
Figure 11:
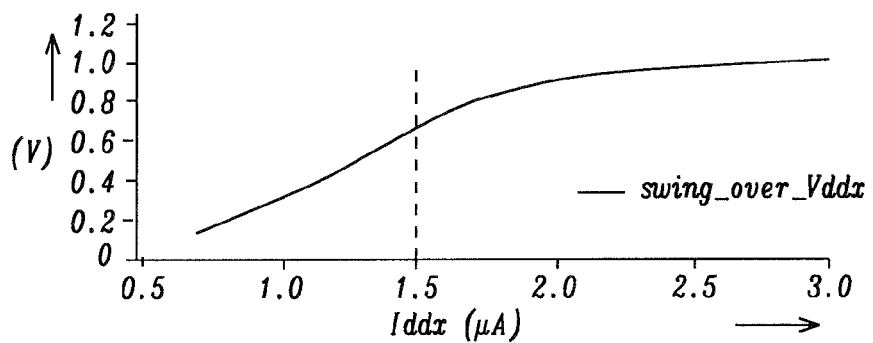
Figure 12:
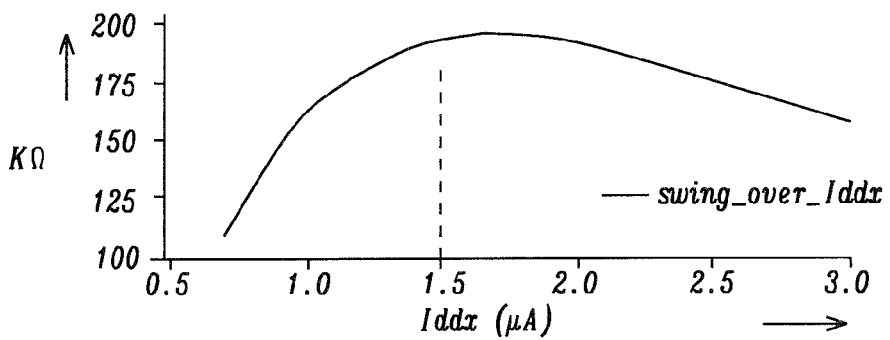
Figure 13:
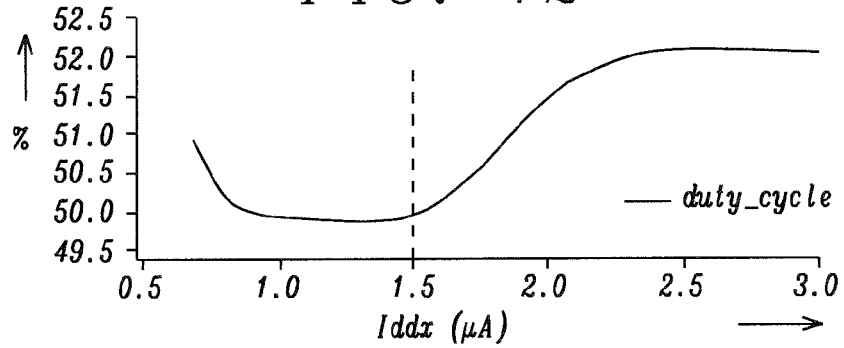
Figure 14:
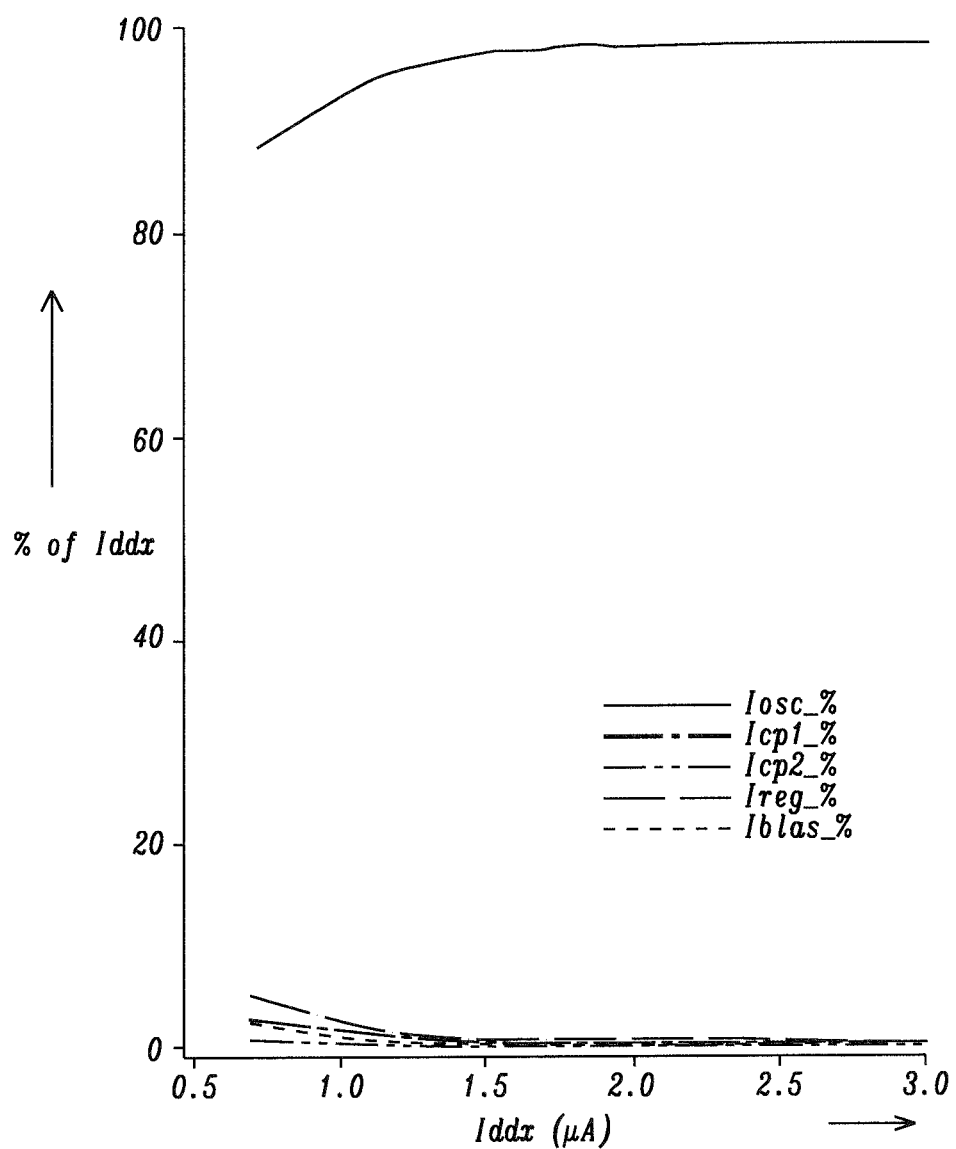
Figure 15:
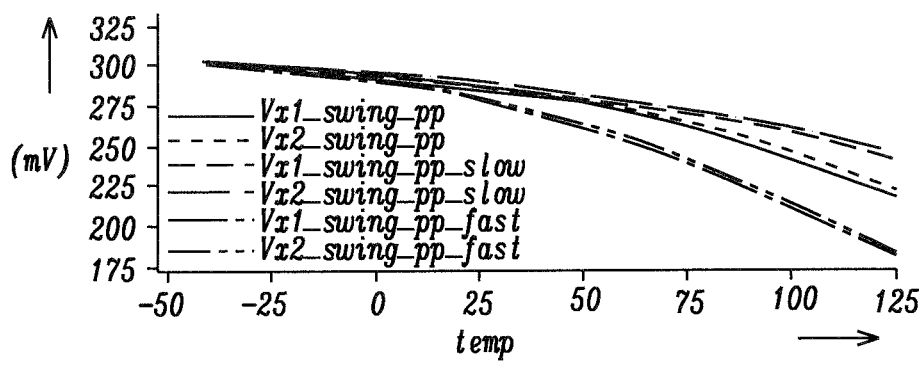
Figure 16:
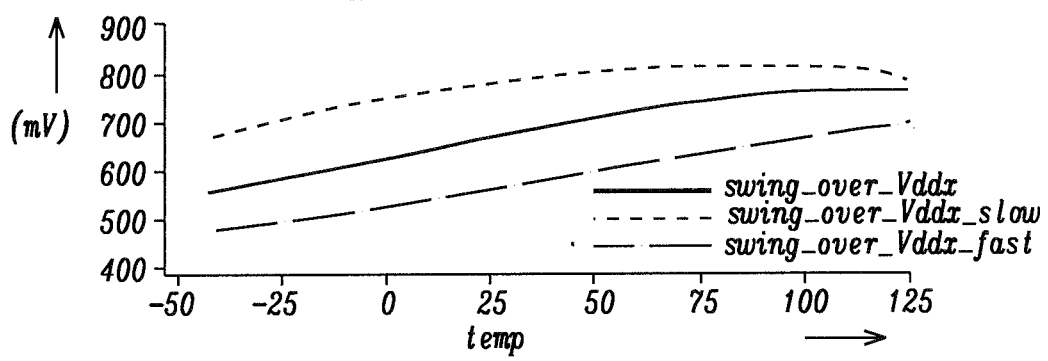
Figure 17:
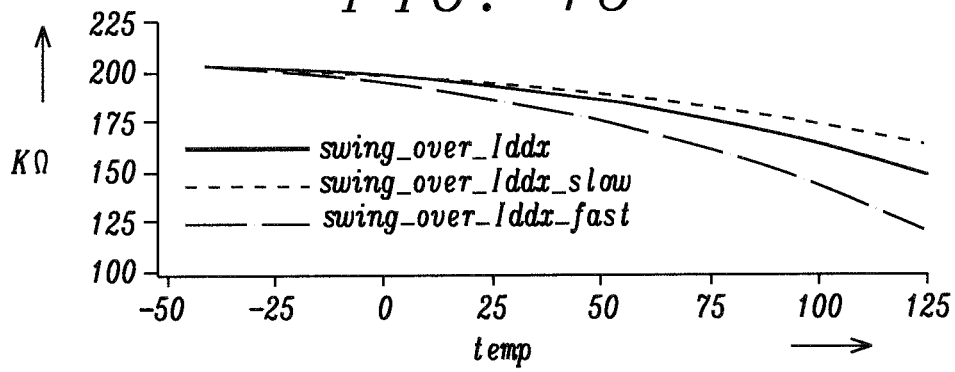
Figure 18:
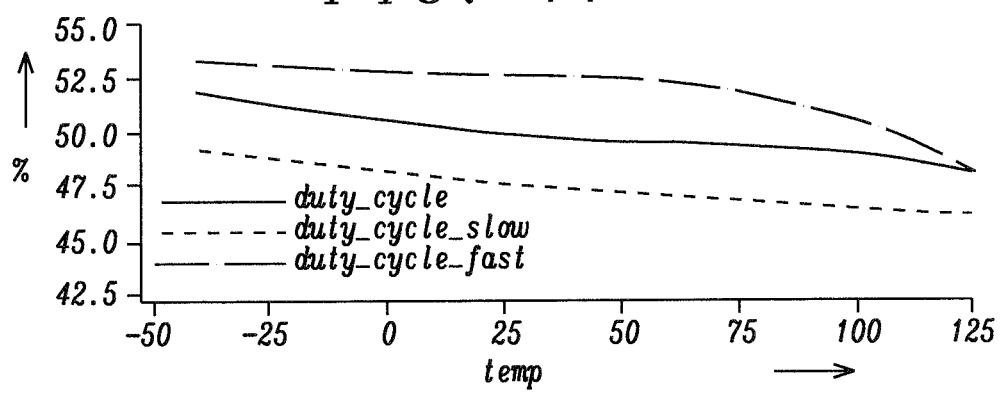

FIG. 4 shows an alternative bias circuit BC' to the one shown in FIG. 2 as well as an example of the operational amplifier $OA_1$ of the oscillator circuit in which same reference number refer to the same components as in FIGS. 2 and 3.

The alternative bias circuit BC' of FIG. 4 includes the regulator $OA_1$ and comprises a plurality of transistors $T_j$ (j=13, 14, . . . 17). Each one of these transistors $T_i$ has a respective gate $G_j$, a source $S_j$, and a drain $D_j$.

The alternative bias circuit BC' of FIG. 4 includes a thirteenth N-type transistor $T_{13}$ having its source terminal $S_{13}$ connected to the drain terminal $D_5$ of transistor $T_5$, its drain terminal $D_{13}$ connected to the drain terminal $D_4$ of transistor $T_4$, to its gate $G_{13}$ and to the gate $G_5$ of transistor $T_5$, a fourteenth N-type transistor $T_{14}$ having a source $S_{14}$ connected to the drain $D_6$ of the transistor $T_6$ and a gate $G_{14}$ connected to the first end $r_{21}$ of the resistor $R_2$ (not shown in FIG. 4), a fifteenth N-type transistor $T_{15}$ having a source $S_{15}$ connected to the drain $D_6$ of the transistor $T_6$ and a gate $G_{15}$ connected to the first end $r_{41}$ of the resistor $R_4$ (not shown in FIG. 4), a sixteenth P-type transistor $T_{16}$ having a drain $D_{16}$ connected to the drain $D_{14}$ of the transistor $T_{14}$, a gate $G_{16}$ connected to the drain $D_{14}$ of the transistor $T_{14}$, and a source $S_{16}$ connected to the current source $I_{ddx}$, and a seventeenth P-type transistor $T_{17}$ having a drain $D_{17}$ connected to the drain $D_{15}$ of the transistor $T_{15}$ and to the first end $r_{31}$ of the resistor $R_3$ (not shown in FIG. 4), a gate $G_{16}$ connected to the drain $D_{14}$ of the transistor $T_{14}$, and a source $S_{17}$ connected to the current source $I_{ddx}$. By doing so, gate $G_{15}$ is the inverting input and gate $G_{14}$ is the non-inverting input, whereas the node of drain $D_{15}$/drain $D_{17}$ is the output of the regulator.

In the set-up of FIG. 4, the additional cascode transistor $T_{13}$ is characterized by having $W_{13}/L_{13}>>\beta$, where $\beta=W/L$ of transistor $T_5$, resulting in a lower gate-source voltage Vgs13, and the drain-source voltage $Vds_5$ across drain $D_5$ and source $S_5$ meeting the condition: $Vds_5>Vd_{sat5}$, where $Vd_{sat5}$ is the saturation voltage of transistor $T_5$. So, transistor $T_5$ is in saturation.

In an example, transistor $T_6$ meets the condition 2*W/L and the condition $Vds_6>Vd_{sat6}$. So, transistor $T_6$ is in saturation too.

For both transistors $T_{14}$ and $T_{15}$ are characterized by having $W_{14}/L_{14}>>\beta$ and $W_{15}/L_{15}>>\beta$.

Because of these conditions being met, the regulator stage R/LPF (here comprising transistors $T_6$, $T_{14}$, $T_{15}$, $T_{16}$, $T_{17}$ is having all transistors in saturation if:

$$Vin+\approx Vin-\approx V_N\approx V_{ddx}-V_P,$$

The current driven crystal oscillator circuit illustrated in FIG. 2 may work in a transceiver mode wherein stabilized frequencies for radio transmitters and/or receivers can be generated. In this mode, rising/falling edges of the generated oscillating signal as eventually produced should be as accurate as possible such that they define moments in time at which certain actions may start/end are as accurate as possible. This is achieved by injecting relatively more current in the oscillator circuit by current source $I_{ddx}$ such that lower phase noise is obtained.

Circuit dimensions are linear proportional to a large extend to the crystal frequency. The following main parameters may apply to the circuit of FIG. 2:

$f_{XTAL}$ frequency of the crystal $X_1$ (e.g. 16 MHz).

$I_{ddx}$ supply current injected into the oscillator.

$I_S$ start-up current.

$f_{LPF}$ turn-over frequency of the low-pass filters $C_4$, $R_2$ and $C_5$, $R_4$.

$C_{DDX}$ $V_{DDX}$ smoothing capacitor (e.g. 50 pF; $C_7$ in FIG. 2).

$R_{SPN}$ equivalence series resistance of resistors $R_5$ and $R_6$ in the oscillator stage OS.

$R_{START}$ resistance of the feedback resistor in the start-up mode ($R_7$ in FIG. 2).

$R_S$ equivalence series resistance of resistor ($R_3$ in FIG. 2) and the regulator $OA_1$ in the OA/LPF.

$\beta_{BIAS}$ channel width divided by channel length of the channel of the NMOS transistor of the bias circuit BS ($T_5$ in FIG. 2).

$\beta_{OSC}$ channel width divided by channel length of the channel of the NMOS transistor in the oscillator stage OS ($T_8$).

$\beta_{CP1}$ channel width divided by channel length of the channel of the NMOS transistor of the current-mode comparator CMC ($T_{10}$ in FIG. 2).

$\beta_{CP2}$ channel width divided by channel length of the channel of the NMOS transistor of the output circuit OC ($T_{12}$ in FIG. 2).

$\alpha_{PN}$ channel width divided by channel length of the channel of the PMOS transistor divided by channel width divided by channel length of the channel of the NMOS transistor in the bias circuit BC, oscillator stage OScurrent-mode comparator CMC and output circuit OC.

$C_L$ Load capacitors (specified by crystal manufacturer; $C_6$, $C_8$ in FIG. 2).

In one embodiment of the current driven crystal oscillator circuit of FIG. 2 working in a transceiver mode, the plurality of circuit dimensions of FIG. 2 may have the following values:

$I_{ddx}\approx f_{XTAL}*2$ pA/Hz ($\approx 32$ μA at $f_{XTAL}=16$ MHz; $\approx 64$ nA at $f_{XTAL}=32$ kHz)

$f_{LPF}\approx f_{XTAL}/40$ ($\approx 400$ kHz at $f_{XTAL}=16$ MHz; e.g. C=2 pF and R=200 kΩ)

$R_{SPN}\approx 60$ mV/$I_{ddx}$ ($\approx 1800\Omega$ at $f_{XTAL}=16$ MHz)

$\beta_{BIAS}\approx 250$ μA/$I_{ddx}$ ($\approx 8\approx 0.2*2.4$ μm/60 nm at $f_{XTAL}=16$ MHz;

so if L=60 nm then W=0.2*2.4μ=0.48 μm)

$\beta_{OSC}\approx 62.5$ mA/$I_{ddx}$ ($\approx 2000\approx 50*2.4$ μm/60 nm at $f_{XTAL}=16$ MHz)

$\beta_{CP1}\approx 12.5$ mA/$I_{ddx}$ ($\approx 400\approx 10*2.4$ μm/60 nm at $f_{XTAL}=16$ MHz)

$\beta_{CP2}\approx 1.25$ mA/$I_{ddx}$ ($\approx 40\approx 1*2.4$ μm/60 nm at $f_{XTAL}=16$ MHz)

$\alpha_{PN}$ 2.5 and the channel width divided by channel length of the channel of $T_6$ is $2*\beta_{BIAS}$.

These parameters may have a value in a range from 50% to 150% of the above nominal values. Preferably, these parameters may have a value in a range from 75% to 125% of the above nominal values and even more preferably, these parameters may have a value in a range from 90% to 110% of the above nominal values.

In this way, the current provided by the current source $I_{ddx}$ of the current driven crystal oscillator circuit of FIG. 2 working in a transceiver mode will be distributed between the different blocks in the following way: current $I_{bias}$ of the bias circuit will be $\approx 2.5\%$ of current $I_{ddx}$, current $I_{osc}$ of the oscillator stage OS will be $\approx 78\%$ of current $I_{ddx}$, current $I_{cp1}$ of the current-mode comparator CMC will be $\approx 14\%$ of current $I_{ddx}$, and current $I_{cp2}$ of the output circuit OC will be $\approx 0.5\%$ of current $I_{ddx}$. The remaining 5% of $I_{ddx}$ current is consumed by the regulator ($OA_1$).

FIG. 5, FIG. 6, FIG. 7, FIG. 8 and FIG. 9 illustrate simulation results of the current driven crystal oscillator circuit of FIG. 2 working in a transceiver mode. In FIG. 5, FIG. 6, FIG. 7 and FIG. 8 the horizontal axes represent in microamperes the current $I_{ddx}$ of the current driven crystal oscillator circuit of FIG. 2 working in a transceiver mode. The vertical axes represent: in FIG. 5, $V_{x1}$, $V_{x2}$, and avg_vddx represented in volts, in FIG. 6, the ratio of swing voltage represented in volts to $V_{ddx}$ represented in volts, in FIG. 7, the efficiency factor defined by the ratio of swing voltage represented in volts to current $I_{ddx}$ represented in amperes, and in FIG. 8, the duty cycle of the output signal as provided by the level shifter L.In FIG. 9, the horizontal axis also represents in microamperes the current $I_{ddx}$, which represents the total current of the whole current driven crystal oscillator circuit of FIG. 2; working in a transceiver mode and along the vertical axis five curves are illustrated which represent respectively the percentage % of current $I_{ddx}$ that goes to $I_{CP2}$, the percentage % of current $I_{ddx}$ that goes to current $I_{bias}$, the percentage % of current $I_{ddx}$ that goes to current $I_{reg}$, the percentage % of current $I_{ddx}$ that goes to current $I_{CP1}$ and the percentage % of current $I_{ddx}$ that goes to current $I_{OSC}$.

As shown in the simulations illustrated in FIG. 5, FIG. 6, FIG. 7, FIG. 8 and FIG. 9 the current $I_{ddx}$ is swept from 10 microampere to 300 microamperes, the capacitors $C_6$ and $C_8$ have a capacitance of 18 picofarads, and the circuit works at a temperature of 25 degrees Celsius.

To accelerate the start-up of the crystal oscillator a relative high current ($I_S$ in FIG. 2) is injected in the transceiver mode configuration while resistors $R_5$ and $R_6$ are shorted by a switches and switch SW2 (in FIG. 2) is closed. More than 90% of the injected current (sum of $I_{ddx}$ and $I_S$) flows in the oscillator stage ($T_7$ and $T_8$) maximizing its transconductance. Start-up resistor $R_{START}$ ($R_7$ in FIG. 2) takes care that the input and output voltage of the oscillator stage are approximately equal at start-up independent of the regulator ($OA_1$ in FIG. 2). A 12-bit clock counter ($2^{12}$=4096 clock pulses) which is reset by a POR (Power-On Reset)-signal can be used to switch from start-up mode to transceiver mode after starting the oscillator. Resistor $R_{START}$ ($R_7$ in FIG. 2) can be 100 kΩ and $I_S$ can be 1 mA for a 16 MHz crystal. For a lower crystal frequency a higher value for $R_{START}$ can be used in combination with a lower start-up current ($I_S$).

The current driven crystal oscillator circuit illustrated in FIG. 2 can also work in a timer mode in order to provide a stable clock signal. In this embodiment, requirements as to phase noise are less strict because the timer will count an average number of oscillation cycles by counting the number of rising/falling edges only. So, here, the current as injected into the oscillator circuit by current source $I_{ddx}$ can be much less than in the transceiver mode.

In one embodiment of the current driven crystal oscillator circuit of FIG. 2 working in a timer mode, the plurality of circuit dimensions of FIG. 2 may have the following values:

$I_{ddx} \approx f_{XTAL} * 125$ fA/Hz($\approx 2$ μA at $f_{XTAL}$=16 MHz; $\approx 4$ nA at $f_{XTAL}$=32 kHz)

$f_{LPF} \approx f_{XTAL}/40$ ($\approx 400$ kHz at $f_{XTAL}$=16 MHz)

$R_{SPN} \approx 0$ mV/$I_{ddx}$ ($\approx 0Ω$ at $f_{XTAL}$=16 MHz→closed switch over $R_5$ and $R_6$ in FIG. 2)

$\beta_{BIAS} \approx 16$ μA/$I_{ddx}$ ($\approx 8 \approx 0.2*2.4$ μm/60 nm at $f_{XTAL}$=16 MHz;

so if L=60 nm then W=0.2*2.4μ=0.48 m)

$\beta_{OSC} \approx 1.25$ mA/$I_{ddx}$ ($\approx 640 \approx 16*2.4$ μm/60 nm at $f_{XTAL}$=16 MHz)

$\beta_{CP1} \approx 16$ μA/$I_{ddx}$ ($\approx 8 \approx 0.2*2.4$ μm/60 nm at $f_{XTAL}$=16 MHz)

$\beta_{CP2} \approx 8$ μA/$I_{ddx}$ ($\approx 4 \approx 0.1*2.4$ μm/60 nm at $f_{XTAL}$=16 MHz)

$\alpha_{PN} \approx 2.5$ and the channel width divided by channel length of the channel of $T_6$ is 2*βBIAS These parameters may have a value in a range from 50% to 150% of the above nominal values. Preferably, these parameters may have a value in a range from 75% to 125% of the above nominal values and even more preferably, these parameters may have a value in a range from 90% to 110% of the above nominal values.

In this way, the current provided by the current source $I_1$ of the current driven crystal oscillator circuit of FIG. 2 working in a timer mode will be distributed between the different blocks in the following way: current $I_{bias}$ of the bias circuit will be $\approx 0.5$% of current $I_1$, current $I_{osc}$ of the oscillator stage OS will be $\approx 97$% of current $I_1$, current $I_{cp1}$ of the current-mode comparator CMC will be $\approx 1$% of current $I_1$, and current $I_{cp2}$ of the output circuit OC will be $\approx 0.1$% of current $I_1$. The remaining 1% of $I_1$ current is consumed by the regulator ($OA_1$).

FIG. 10, FIG. 11, FIG. 12 and FIG. 13 and FIG. 14 illustrate simulation results of the current driven crystal oscillator circuit of FIG. 2 working in a timer mode. In FIG. 10, FIG. 11, FIG. 12 and FIG. 13 and FIG. 14, the same results as in FIG. 5, FIG. 6, FIG. 7, FIG. 8 and FIG. 9, but for the timer mode, are represented, respectively. In the simulations for obtaining the results represented in FIG. 10, FIG. 11, FIG. 12 and FIG. 13 and FIG. 14, the current $I_{ddx}$ varies between 0.7 microampere and 3 microamperes, the capacitors $C_6$ and $C_8$ have a capacitance of 8 picofarads, and the circuit temperature works at 25 degrees Celsius.

FIG. 15, FIG. 16, FIG. 17 and FIG. 18 also illustrate simulation results of the current driven crystal oscillator circuit of FIG. 2 working in a timer mode. In FIG. 15, FIG. 16, FIG. 17 and FIG. 18, the horizontal axes represent temperature in degrees Celsius. The vertical axes represent: in FIG. 15, $V_{x1}$ and $V_{x2}$ represented in volts, in FIG. 16, the ratio of swing voltage represented in volts to $V_{ddx}$ represented in volts, in FIG. 17, the efficiency factor defined by the ratio of swing voltage represented in volts to current $I_{ddx}$ represented in amperes, and in FIG. 18, the duty cycle of the output signal as provided by the level shifter L, wherein for each of the four figures, three curves are shown for each parameter representing simulation results for nominal process corner and for the extremes of the processing corners: the so-called 'fast' corner and the 'slow' corner. In the slow corner all process parameters are set to the processing limits which results to the slowest possible circuits.

Figure 19:
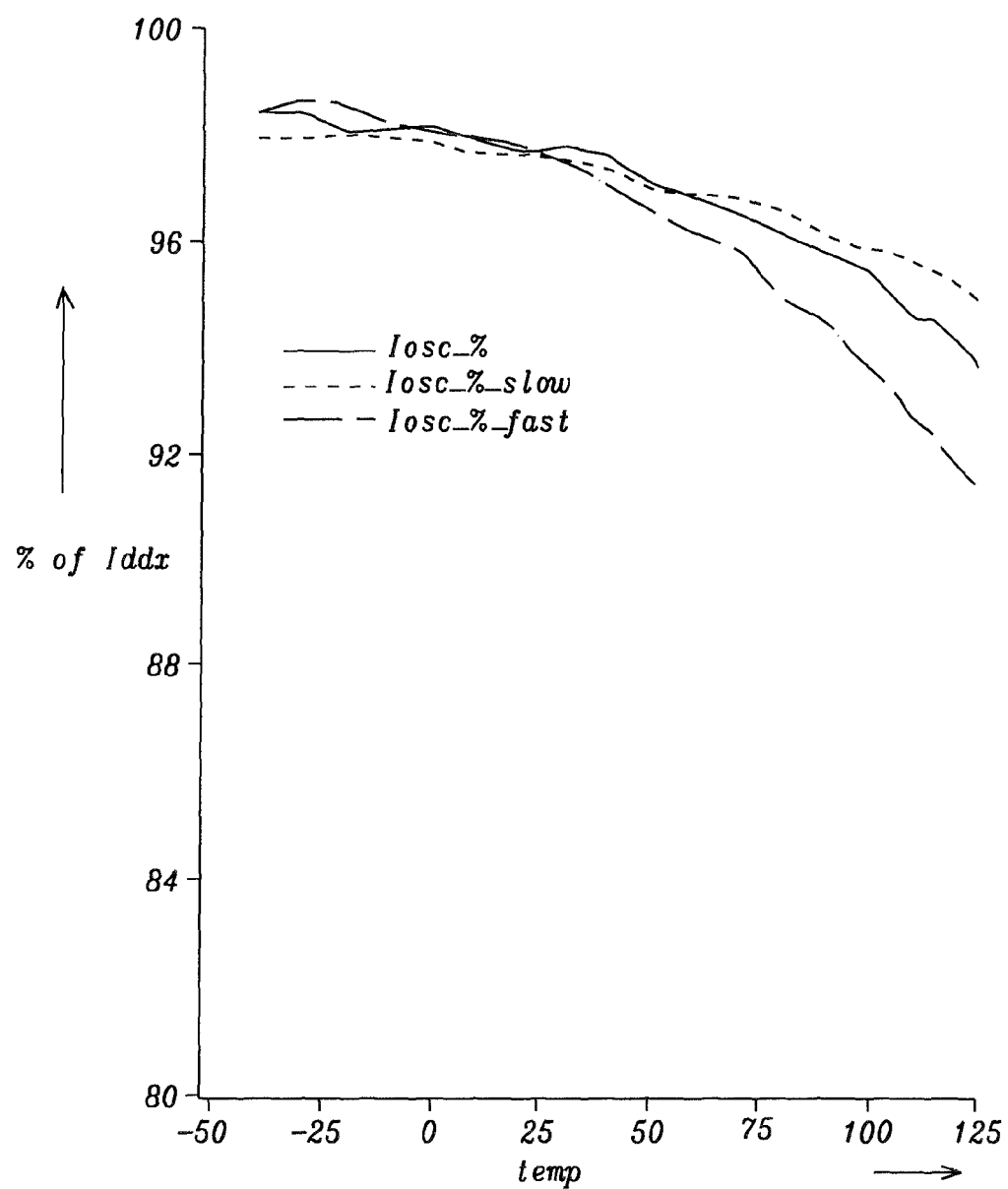

FIG. 19 illustrates simulation results of the current driven crystal oscillator circuit of FIG. 2 working in a timer mode. In FIG. 19, the horizontal axis represents temperature in degrees Celsius and the vertical axis represents the percentage of current $I_{ddx}$ that goes to current $I_{OSC}$. Also here three curves are shown.

During the simulations for obtaining the results represented in FIG. 10-19, the current $I_{ddx}$ was set at 1.5 microamperes, the capacitors $C_6$ and $C_8$ had a capacitance of 8 picofarads, and the circuit temperature sweep over processing corners.

To summarize, the design of the presented oscillator circuit can be optimized for, e.g., three embodiments:

Timer mode: examples of figures are: $i_{osc} \approx 2$ μA; $C_6 = C_8 \approx 8$ pF; $V_{ddx} \approx 450$ mV;

Vx_pp [=peak-to-peak voltage across the crystal $X_1$]$\approx 0.7*V_{ddx}$; phase_noise (10 kHz)$\approx -116$ dBc/Hz;

($i_{osc}$ may be as low as 1 µA in case $C_6=C_8 \approx 3$ pF (parasitics only);

Transceiver mode: examples of figures are: $i_{osc}$=32 µA; 5 pF<$C_6=C_8$<18 pF; $V_{ddx} \approx 750$ mV;

Vx_pp≈1.1*$V_{ddx}$;

phase_noise (10 kHz)<−146 dBc/Hz

Start-up mode: $i_{osc}$=1 mA; $C_6=C_8$=18 pF; $V_{ddx}$<1.4V;

Vx_pp→accelerated start-up

The three embodiments described above wherein the oscillator circuit illustrated in FIG. 2 can work in a transceiver mode, a timer mode, or a accelerated start-up mode, may be combined in a single circuit wherein the circuit may comprise separate, distinct (transistor) elements in the oscillator circuit for each mode and suitably arranged switches arranged to connect or disconnect them to the rest of the oscillator circuit depending on the mode the circuit should work in. For instance, the circuit according to this embodiment may comprise two versions of transistor $T_{10}$, one of them with an area value of 10x and another one with an area value of 0.15x, wherein 1x=2.4 µm/60 nm. If the circuit is working in a transceiver mode the transistor from the two versions of $T_{10}$ with an area value of 10x will be the one connected to the circuit by means of these switches, while if the circuit is working in a timer mode, the transistor with an area of 0.15x will be the one connected to the circuit by means of these switches.

It will be clear to a person skilled in the art that the scope of the invention is not limited to the examples discussed in the foregoing, but that several amendments and modifications thereof are possible without deviating from the scope of the invention as defined in the attached claims. While the invention has been illustrated and described in detail in the figures and the description, such illustration and description are to be considered illustrative or exemplary only, and not restrictive. The present invention is not limited to the disclosed embodiments but comprises any combination of the disclosed embodiments that can come to an advantage. The invention is limited by the attached claims and their technical equivalents only.

Variations to the disclosed embodiments can be understood and effected by a person skilled in the art in practicing the claimed invention, from a study of the figures, the description and the attached claims. In the description and claims, the word "comprising" does not exclude other elements, and the indefinite article "a" or "an" does not exclude a plurality. In fact it is to be construed as meaning "at least one". The mere fact that certain features are recited in mutually different dependent claims does not indicate that a combination of these features cannot be used to advantage. Any reference signs in the claims should not be construed as limiting the scope of the invention.

What is claimed is:

1. An oscillator circuit comprising an oscillator stage and a first current source arranged to drive said oscillator stage, the oscillator stage comprising an oscillator stage input terminal, an oscillator stage output terminal, an oscillator arranged to provide an oscillating signal between said oscillator stage input terminal and said oscillator stage output terminal, said oscillator circuit comprising an operational amplifier with an inverting input, a non-inverting input and an operational amplifier output, said oscillator stage input terminal and said oscillator stage output terminal being coupled to said inverting input and non-inverting input, and said operational amplifier output being coupled to the oscillator stage input terminal such that said oscillator stage input terminal and said oscillator stage output terminal are controlled to have a same DC voltage level.

2. The oscillator circuit according to claim 1, further comprising a first capacitor connected to the oscillator stage input terminal and a second capacitor connected to the oscillator stage output terminal.

3. The oscillator circuit according to claim 2, further comprising a third capacitor connected to the inverting input of the operational amplifier and a fourth capacitor connected to the non-inverting input of the operational amplifer.

4. The oscillator circuit according to claim 1, wherein said operational amplifier output is connected to said the oscillator stage input terminal via a first resistor.

5. The oscillator circuit according to claim 4, wherein said oscillator stage comprises a series connection of a first transistor and a second transistor connected at a first junction, said first transistor having a first gate and said second transistor having a second gate, said first gate and said second gate being connected to one another at a second junction, said second junction being connected to a first oscillator terminal of the oscilator and said first junction being connected to a second oscillator terminal of the oscillator.

6. The oscillator circuit according to claim 5, wherein the series connection of said first transistor and said second transistor are arranged such as to receive an oscillator stage current from said first current source.

7. The oscillator circuit according to claim 6, wherein one side of said series connection of said first transistor and said second transistor is connected to said first current source via a second resistor, and an other side of said series connection of said first transistor and said second transistor is connected to ground via a third resistor.

8. The oscillator circuit according to claim 5, wherein said operational amplifier is arranged to receive electrical power from a third transistor which is arranged in a current mirror arrangement with a fourth transistor arranged in a bias circuit, wherein such fourth transistor is arranged to conduct a predetermined DC bias current.

9. The oscillator circuit according to claim 8, wherein said bias circuit comprises a fifth transistor which is arranged in a diode arrangement in series with said fourth transistor and is arranged to receive current from said first current source.

10. The oscillator circuit according to claim 9, wherein said oscillator stage input terminal is, either directly or indirectly, connected to a current mode comparator, said current mode comparator comprising a series connection of a sixth transistor and a seventh transistor connected at a third junction, said sixth transistor ($T_9$) having a sixth transistor gate and said seventh transistor having a seventh transistor gate, said sixth transistor gate and said seventh transistor being connected to one another at a fourth junction, said fourth junction being arranged to receive an oscillating signal from said oscillator stage input terminal, and said series connection of said sixth transistor and said seventh transistor being arranged to receive current from said first current source.

11. The oscillator circuit according to claim 10, wherein said current mode comparator has a current mode comparator output connected to an output circuit, said output circuit comprising a series connection of an eighth transistor and a ninth transistor connected at a fifth junction, said eighth transistor having an eighth transistor gate and said ninth transistor having a ninth transisitor gate, said eighth transistor gate and said ninth transistor being connected to one another at a sixth junction, said sixth junction being arranged to receive a signal from said current mode comparator output, and said series connection of said eighth transistor and said ninth transistor being arranged to receive current from said first current source.

12. The oscillator circuit according to claim 11, wherein said output circuit has an output circuit output connected to an input of a level shifter which is arranged to shift a logic level of an output circuit output signal.

13. The oscillator circuit according to claim 4, wherein the oscillator circuit comprises a second resistor which is arranged in a series connection with a first switch, which series connection of said second resistor and said first switch is connected between said first oscillator terminal and said second oscillator terminal, the oscillator circuit being arranged to switch on said first switch at start-up of the oscillator circuit and to switch off said first switch after a start-up phase.

14. The oscillator circuit according to claim 13, wherein the oscillator circuit comprises a series connection of a second current source and a current source switch, said series connection of a second current source and a current source switch being arranged in parallel to said first current source.

15. The oscillator circuit according to claim 11, wherein a crystal $X_1$ has an oscillating frequency $f_{x1}$, the fourth transistor comprises a channel having a channel width divided by a channel length equal to $\beta_{BIAS}$, the second transistor comprises a channel having a channel width divided by a channel length equal to $\beta_{osc}$, the seventh transistor comprises a channel having a channel width divided by a channel length equal to $\beta_{CP1}$, the ninth transistor comprises a channel having a channel width divided by a channel length equal to $\beta_{CP2}$, the fifth transistor comprises a channel having a channel width divided by a channel length equal to $\beta_{BIAS'}$, the first transistor comprises a channel having a channel width divided by a channel length equal to $\beta_{osc'}$, the sixth transistor comprises a channel having a channel width divided by a channel length equal to $\beta_{CP1'}$, the eighth transistor comprises a channel having a channel width divided by a channel length equal to $\beta_{CP2'}$, the third transistor comprises a channel having a channel width divided by a channel length equal to $\beta_6$, and wherein the first current source $I_{ddx}$ has a range from $(1.5*f_{x1}*2)$ picoampere/Hertz to $(0.5*f_{x1}*2)$ picoampere/Hertz, $\beta_{BIAS}$ has a range from $(375/I_{ddx})$ microampere to $(125/I_{ddx})$ microampere, $\beta_{osc}$ has a range from $(93.75/I_{ddx})$ miliampere to $(31.25/I_{ddx})$ miliampere, $\beta_{CP1}$ has a range from $(18.75/I_{ddx})$ miliampere to $(6.25/I_{ddx})$ miliampere, $\beta_{CP2}$ has a range from $(1.875/I_{ddx})$ miliampere to $(0.625/I_{ddx})$ miliampere, $\beta_{BIAS'}$ has a range from $((2.5*375)/I_{ddx})$ microampere to $((2.5*125)/I_{ddx})$ microampere, $\beta_{osc'}$ has a range from $((2.5*93.75)/I_{ddx})$ miliampere to $((2.5*31.25)/I_{ddx})$ miliampere, $\beta_{CP1'}$ has a range from $((2.5*18.75)/I_{ddx})$ miliampere to $((2.5*6.25)/I_{ddx})$ miliampere, $\beta_{CP2'}$ has a range from $((2.5*1.875)/I_{ddx})$ miliampere to $((2.5*0.625)/I_{ddx})$ miliampere and $\beta_6$ has a range from $(750/I_{ddx})$ microampere to $(250/I_{ddx})$ microampere.

16. The oscillator circuit according to claim 15, wherein the first current source $I_{ddx}$ has a range from preferably $(1.25*f_{x1}*2)$ picoampere/Hertz to $(0.75*f_{x1}*2)$ picoampere/Hertz and more preferably is $(f_{x1}*2)$ picoampere/Hertz, $\beta_{BIAS}$ preferably has a range from $(312.5/I_{ddx})$ microampere to $(187.5/I_{ddx})$ microampere and more preferably is $250/I_{ddx}$ microampere, $\beta_{osc}$ preferably has a range from $(93.75/I_{ddx})$ miliampere to $(31.25/I_{ddx})$ miliampere and more preferably is $62.5/I_{ddx}$ miliampere, $\beta_{CP1}$ preferably has a range from $(15.625/I_{ddx})$ miliampere to $(9.375/I_{ddx})$ miliampere and more preferably is $12.5/I_{ddx}$ miliampere, $\beta_{CP2}$ preferably has a range from $(1.5625/I_{ddx})$ miliampere to $(0.9375/I_{ddx})$ miliampere and more preferably is $1.25/I_{ddx}$ miliampere, $\beta_{BIAS'}$ preferably has a range from $((2.5*312.5)/I_{ddx})$ microampere to $((2.5*187.5)/I_{ddx})$ microampere and more preferably is $(2.5*250)/I_{ddx}$ microampere, $\beta_{osc'}$ preferably has a range from $((2.5*93.75)/I_{ddx})$ miliampere to $((2.5*31.25)/I_{ddx})$ miliampere and more preferably is $(2.5*62.5)/I_{ddx}$ miliampere, $\beta_{CP1'}$ preferably has a range from $((2.5*15.625)/I_{ddx})$ miliampere to $((2.5*9.375)/I_{ddx})$ miliampere and more preferably is $(2.5*12.5)/I_{ddx}$ miliampere $\beta_{CP2'}$ preferably has a range from $((2.5*1.5625)/I_{ddx})$ miliampere to $((2.5*0,9375)/I_{ddx})$ miliampere, more preferably is $(2.5*1.25)/I_{ddx}$ miliampere and $\beta_6$ preferably has a range from $(625/I_{ddx})$ microampere to $(375/I_{ddx})$ microampere and more preferably is $500/I_{ddx}$ microampere.

17. The oscillator circuit according to claim 11, wherein a crystal $X_1$ has an oscillating frequency $f_{x1}$, the fourth transistor $(T_5)$ comprises a channel having a channel width divided by a channel length equal to $\beta_{BIAS}$, the second transistor $(T_8)$ comprises a channel having a channel width divided by a channel length equal to $\beta_{osc}$, the seventh transistor $(T_{10})$ comprises a channel having a channel width divided by a channel length equal to $\beta_{CP1}$, the ninth transistor $(T_{12})$ comprises a channel having a channel width divided by a channel length equal to $\beta_{CP2}$, the fifth transistor $(T_4)$ comprises a channel having a channel width divided by a channel length equal to $\beta_{BIAS'}$, the first transistor $(T_7)$ comprises a channel having a channel width divided by a channel length equal to $\beta_{osc'}$, the sixth transistor $(T_9)$ comprises a channel having a channel width divided by a channel length equal to $\beta_{cp1'}$, the eighth transistor $(T_{11})$ comprises a channel having a channel width divided by a channel length equal to $\beta_{CP2'}$, the third transistor $(T_6)$ comprises a channel having a channel width divided by a channel length equal to $\beta_6$ and wherein the first current source $I_{ddx}$ has a range from $(f_{x1}*187.5)$ femtoampere/Hertz to $(f_{x1}*62.5)$ femtoampere/Hertz, $\beta_{BIAS}$ has a range from $(24/I_{ddx})$ microampere to $(8/I_{ddx})$ microampere, $\beta_{osc}$ has a range from $(1.875/I_{ddx})$ miliampere to $(0.625/I_{ddx})$ miliampere, $\beta_{CP1}$ has a range from $(24/I_{ddx})$ microampere to $(8/I_{ddx})$ microampere, $\beta_{CP2}$ has a range from $(1.875/I_{ddx})$ microampere to $(0.625/I_{ddx})$ microampere, $\beta_{BIAS'}$ has a range from $((2.5*24)/I_{ddx})$ microampere to $((2.5*8)/I_{ddx})$ microampere, $\beta_{osc'}$ has a range from $((2.5*1.875)/I_{ddx})$ miliampere to $((2.5*0.625)/I_{ddx})$ miliampere, $\beta_{CP1'}$ has a range from $((2.5*24)/I_{ddx})$ microampere to $((2.5*8)/I_{ddx})$ microampere, $\beta_{CP2'}$ has a range from $((2.5*1.875)/I_{ddx})$ microampere to $((2.5*0.625)/I_{ddx})$ microampere and $\beta_6$ has a range from $(48/I_{ddx})$ microampere to $(16/I_{ddx})$ microampere.

18. The oscillator circuit according to claim 17, wherein the first current source $I_{ddx}$ preferably has a range from $(f_{x1}*156.25)$ femtoampere/Hertz to $(f_{x1}*93.75)$ femtoampere/Hertz and more preferably is $(f_{x1}*125)$ femtoampere/Hertz, $\beta_{BIAS}$ preferably has a range from $(20/I_{ddx})$ microampere to $(12/I_{ddx})$ microampere and more preferably is $(16/I_{ddx})$ microampere, $\beta_{osc}$ has a range from $(1.5625/I_{ddx})$ miliampere to $(0,9375/I_{ddx})$ miliampere and more preferably is $1.25/I_{ddx}$ miliampere, $\beta_{CP1}$ preferably has a range from $(20/I_{ddx})$ microampere to $(12/I_{ddx})$ microampere and more preferably is $(16/I_{ddx})$ microampere, $\beta_{CP2}$ preferably has a range from $(10/I_{ddx})$ microampere to $(6/I_{ddx})$ miliampere and more preferably is $8/I_{ddx}$ miliampere, $\beta_{BIAS'}$ preferably has a range from $((2.5*20)/I_{ddx})$ microampere to $((2.5*12)/I_{ddx})$ microampere and more preferably is $((2.5*16)/I_{ddx})$ microampere, $\beta_{osc'}$ has a range from $((2.5*1.5625)/I_{ddx})$ miliampere to $((2.5*0,9375)/I_{ddx})$ miliampere and more preferably is $(2.5*1.25)/I_{ddx}$ miliampere, $\beta_{CP1'}$ preferably has a range from $((2.5*20)/I_{ddx})$ microampere to $((2.5*12)/I_{ddx})$ microampere and more preferably is $((2.5*16)/I_{ddx})$ microampere, $\beta_{CP2'}$ has a range from $((2.5*10)/I_{ddx})$ miliampere to $((2.5*6)/I_{ddx})$ miliampere and more preferably is $(2.5*8)/I_{ddx}$ miliampere and $\beta_{BIAS}$ preferably has a range from $(40/I_{ddx})$ microampere to $(24/I_{ddx})$ microampere and more preferably is $(32/I_{ddx})$ microampere.

* * * * *